United States Patent
Lee et al.

(10) Patent No.: US 10,756,305 B2
(45) Date of Patent: Aug. 25, 2020

(54) ELECTROLUMINESCENCE DISPLAY APPARATUS

(71) Applicant: LG Display Co., Ltd., Seoul (KR)

(72) Inventors: HakMin Lee, Paju-si (KR); HeeJin Kim, Paju-si (KR); SungSoo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/215,277

(22) Filed: Dec. 10, 2018

(65) Prior Publication Data

US 2019/0207166 A1 Jul. 4, 2019

(30) Foreign Application Priority Data

Dec. 28, 2017 (KR) .......................... 10-2017-0182946

(51) Int. Cl.
| | | |
|---|---|---|
| *H01L 51/50* | (2006.01) | |
| *H01L 51/52* | (2006.01) | |
| *H01L 27/32* | (2006.01) | |
| *H01L 51/00* | (2006.01) | |

(52) U.S. Cl.
CPC ...... *H01L 51/5275* (2013.01); *H01L 27/3211* (2013.01); *H01L 51/5004* (2013.01); *H01L 51/5056* (2013.01); *H01L 51/5072* (2013.01); *H01L 51/5088* (2013.01); *H01L 51/5206* (2013.01); *H01L 51/5265* (2013.01); *H01L 27/3246* (2013.01); *H01L 51/0004* (2013.01); *H01L 51/5012* (2013.01); *H01L 2251/55* (2013.01)

(58) Field of Classification Search
CPC ............. H01L 51/5275; H01L 51/5004; H01L 51/5265; H01L 27/3211; H01L 51/5206; H01L 51/5012; H01L 27/3246; H01L 51/5221
See application file for complete search history.

(56) References Cited

U.S. PATENT DOCUMENTS

| | | | |
|---|---|---|---|
| 7,176,621 B2* | 2/2007 | Do ...................... | H01L 51/5271 313/498 |
| 10,333,107 B2* | 6/2019 | Lee ...................... | H01L 51/5275 |
| 2016/0155982 A1* | 6/2016 | Jeong .................. | H01L 51/5215 257/40 |
| 2017/0309852 A1* | 10/2017 | Seo ...................... | H01L 51/5004 |

FOREIGN PATENT DOCUMENTS

KR 10-1713945 B1 3/2017

* cited by examiner

*Primary Examiner* — Sonya McCall-Shepard
(74) *Attorney, Agent, or Firm* — Seed IP Law Group LLP

(57) ABSTRACT

Disclosed is an electroluminescence display apparatus for increasing a micro-cavity effect and preventing a device characteristic from being reduced. The electroluminescence display apparatus including an active area where a plurality of pixels are provided includes a substrate, a circuit element layer on the substrate, a first electrode on the circuit element layer, a light emitting layer on the first electrode, a second electrode on the light emitting layer, and a first light compensation layer between the light emitting layer and the second electrode. Since the first light compensation layer having a refractive index lower than that of the light emitting layer is disposed between the light emitting layer and the second electrode, light may be repeatedly reflected thereby increasing light efficiency, which in turn increases the micro-cavity effect.

15 Claims, 5 Drawing Sheets

ELECTROLUMINESCENCE DISPLAY APPARATUS

CROSS-REFERENCE TO RELATED APPLICATIONS

This application claims the benefit of the Korean Patent Application No. 10-2017-0182946 filed on Dec. 28, 2017, which is hereby incorporated by reference as if fully set forth herein.

BACKGROUND

Technical Field

The present disclosure relates to an electroluminescence display apparatus, and more particularly, to an electroluminescence display apparatus for increasing a micro-cavity effect and preventing a device characteristic from being reduced.

Description of the Related Art

Electroluminescence display apparatuses are apparatuses where a light emitting layer is provided between two electrodes and emits light with an electric field between the two electrodes, thereby displaying an image.

The light emitting layer may be formed of an organic material or an inorganic material such as a quantum dot. In the light emitting layer, an exciton is generated by a combination of an electron and a hole, and when the exciton is shifted from an excited state to a ground state, light is emitted.

Hereinafter, a related art electroluminescence display apparatus will be described with reference to the drawing.

Figure 1:
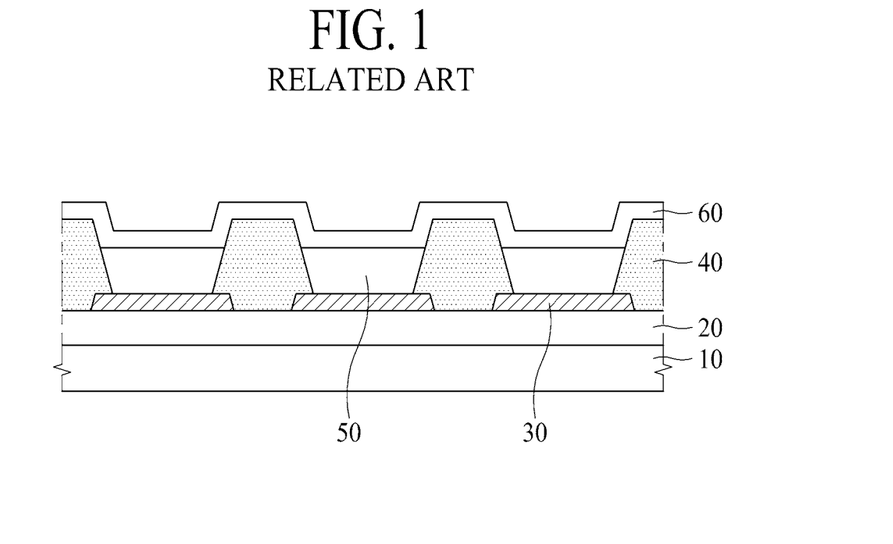
FIG. 1 is a schematic cross-sectional view of a related art electroluminescence display apparatus.

FIG. 1 is a schematic cross-sectional view of a related art electroluminescence display apparatus.

As seen in FIG. 1, the related art electroluminescence display apparatus includes a substrate 10, a circuit element layer 20, a first electrode 30, a bank 40, a light emitting layer 50, and a second electrode 60.

The circuit element layer 20 is provided on the substrate 10. Various signal lines, a thin film transistor (TFT), a capacitor, and a planarization layer are provided in the circuit element layer 20.

The first electrode 30 is provided on the circuit element layer 20. The first electrode 30 is patterned in each of a plurality of pixels and acts as an anode of the related art electroluminescence display apparatus.

The bank 40 is provided in a matrix structure to form an emission area.

The light emitting layer 50 is provided in the emission area formed by the bank 40.

The second electrode 60 is provided on the light emitting layer 50. The second electrode 60 is provided as a common layer of a plurality of pixels and acts as a cathode of the related art electroluminescence display apparatus.

In the related art electroluminescence display apparatus, since light emitted from the light emitting layer 50 is repeatedly reflected between the light emitting layer 50 and the first electrode 30, and thus light efficiency increases. This denotes a micro-cavity effect. However, in the related art electroluminescence display apparatus, the light emitted from the light emitting layer is reflected by the first electrode 30, and most of the light is output to the outside. Due to this, the micro-cavity effect is not large.

Moreover, in the related art electroluminescence display apparatus, since the second electrode 60 including a metal material is provided on the light emitting layer 50, an interface characteristic between the light emitting layer 50 and the second electrode 60 is not good, and due to this, a device characteristic is reduced.

BRIEF SUMMARY

Accordingly, the present disclosure is directed to providing an electroluminescence display apparatus that substantially obviates one or more problems due to limitations and disadvantages of the related art.

One aspect of the present disclosure is directed to providing an electroluminescence display apparatus for increasing a micro-cavity effect and preventing a device characteristic from being reduced.

Another aspect of the present disclosure is to increase the light efficiency in an electroluminescence display apparatus which will extend the life span of the display apparatus.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescence display apparatus including a substrate, a circuit element layer on the substrate, a first electrode on the circuit element layer, a light emitting layer on the first electrode, a second electrode on the light emitting layer, and a first light compensation layer between the light emitting layer and the second electrode.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

The terms described in the specification should be understood as follows.

As used herein, the singular forms "a," "an" and "the" are intended to include the plural forms as well, unless the context clearly indicates otherwise. The terms "first" and "second" are for differentiating one element from the other element, and these elements should not be limited by these terms. It will be further understood that the terms "comprises," "comprising," "has," "having," "includes" and/or "including," when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of an electroluminescence display apparatus according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Hereinafter, exemplary embodiments of the present disclosure will be described in detail with reference to the accompanying drawings.

Figure 2:
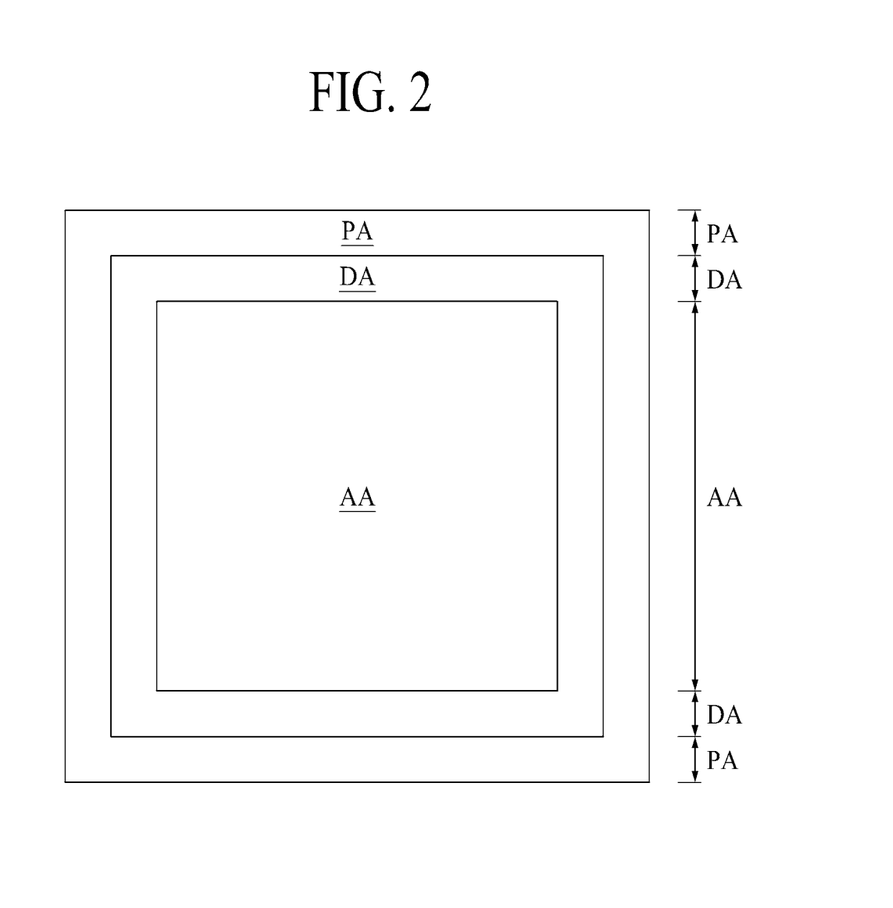
FIG. 2 is a schematic plan view of an electroluminescence display apparatus according to an embodiment of the present disclosure.

FIG. 2 is a schematic plan view of an electroluminescence display apparatus according to an embodiment of the present disclosure.

As seen in FIG. 2, the electroluminescence display apparatus according to an embodiment of the present disclosure may include an active area AA, a dummy area DA, and a pad area PA.

The active area AA may function as a display area which displays an image. A plurality of pixels may be provided in the active area AA, and an emission area may be provided in each of the plurality of pixels.

In detail, signal lines such as a gate line, a data line, a power line, and a reference line may be provided in each of the plurality of pixels provided in the active area AA. Also, a plurality of thin film transistors (TFTs) for switching transfer of signals applied through the signal lines may be provided in each pixel provided in the active area AA, and a light emitting device which is driven by the plurality of TFTs to emit light may be provided in each pixel.

The dummy area DA may be adjacent to the active area AA. In one embodiment, the dummy area DA may be disposed to surround the active area AA.

In detail, the dummy area DA may be disposed in the outer periphery, adjacent to the active area AA. For example, the dummy area DA may be outside of the upper, lower, left, and right sides of the active area AA. A plurality of dummy pixels DP may be provided in the dummy area DA, and a dummy emission area may be provided in each of the plurality of dummy pixels. Since the dummy area DA is not the display area which displays an image, the dummy pixels DP provided in the dummy area DA may have a structure which differs from that of each pixel provided in the active area AA. For example, at least one of a signal line, a TFT, and a light emitting device may not be provided or may be unstably provided in each of the dummy pixels provided in the dummy area DA, and thus, light may not be emitted from each dummy pixel DP provided in the dummy area DA. If light is emitted in the dummy area DA, the image quality of the electroluminescence display apparatus is degraded due to leakage light occurring in the dummy area DA.

The dummy area DA prevents a process error from occurring between a center and an outer portion of the active area AA. This will be described below in detail.

A plurality of stacking processes and a plurality of mask processes may be performed for forming the plurality of pixels in the active area AA. Each of the stacking processes may be a process of forming an insulation layer, a metal layer, or an organic layer through a physical deposition process, a chemical deposition process, a coating process, or an inkjet process, and each of the mask processes may be a process of patterning the insulation layer, the metal layer, or the organic layer formed through the stacking processes to have a certain shape or pattern by using a photolithography process known to those skilled in the art.

As described above, when the plurality of stacking processes and the plurality of mask processes are performed on the active area AA, there is a possibility that a process error occurs between the center and an edge of the active area AA due to process characteristic. For this reason, the dummy area DA may be provided in the edge of the active area AA, and thus, in a case where an error occurs, the error occurs in the dummy area DA without occurring in the active area AA.

Particularly, when a light emitting layer of the light emitting device is formed through an inkjet process, a difference in drying the light emitting layer may occur between a center and an edge of a substrate, and in this case, if the dummy area DA is not provided, light emission between the center and the edge of the active area AA is not uniform.

Therefore, the dummy area DA may be provided outside the active area AA, and thus, in a case where the light emitting layer of the light emitting device is formed through the inkjet process, drying of the light emitting layer is not uniform between the active area AA and the dummy area DA, but drying of the light emitting layer is wholly uniform in the active area AA.

The pad area PA may be disposed outside the dummy area DA.

A circuit driver such as a gate driver or a data driver may be provided in the pad area PA. The circuit driver may be disposed outside of at least one of the upper, lower, left, and right sides of the dummy area DA. The circuit driver provided in the pad area PA may be connected to the circuit element disposed in the active area AA via the dummy area DA.

Figure 3:
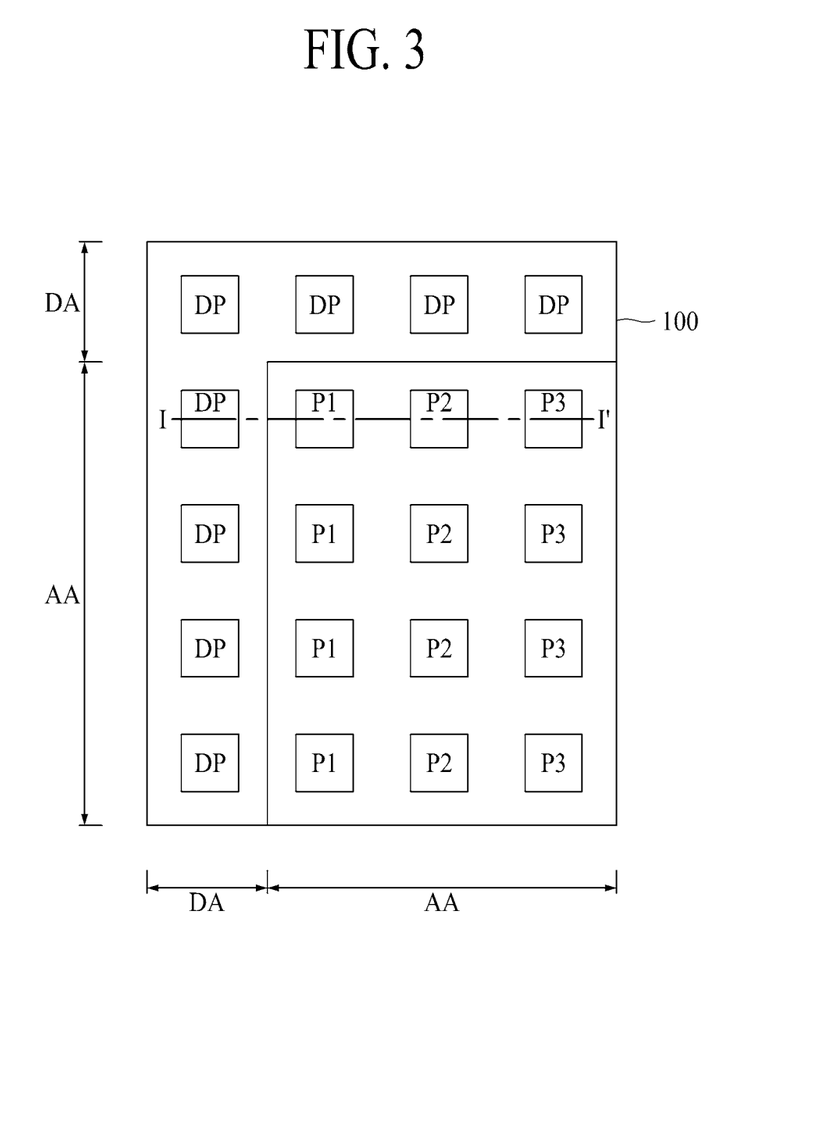
FIG. 3 is a schematic plan view illustrating pixels in an active area and a dummy area of an electroluminescence display apparatus according to an embodiment of the present disclosure.

FIG. 3 is a schematic plan view illustrating pixels in an active area and a dummy area of an electroluminescence display apparatus according to an embodiment of the present disclosure.

As seen in FIG. 3, an active area AA may be provided on a substrate 100, and a dummy area DA may be provided outside the active area AA. FIG. 3 schematically illustrates a left upper area of the substrate 100.

A plurality of first pixels P1 emitting light of a first color, for example, red light, a plurality of second pixels P2 emitting light of a second color, for example, green light, and a plurality of third pixels P3 emitting light of a third color, for example, blue light may be provided in the active area AA.

A plurality of dummy pixels DP may be provided in the dummy area DA. The dummy pixels DP, as described above, may not emit light.

The plurality of first pixels P1, the plurality of second pixels P2, the plurality of third pixels P3, and the plurality of dummy pixels DP may be arranged in a matrix type as illustrated, but the present disclosure is not limited thereto.

The plurality of first pixels P1 may be arranged in one row in one column, the plurality of second pixels P2 may be arranged in one row in another column, and the plurality of third pixels P3 may be arranged in one row in another column, but the present disclosure is not limited thereto.

Some of the plurality of dummy pixels DP may be arranged in a column which differs from a column in which the first pixels P1, the second pixels P2, or the third pixels P3 are arranged. Also, some of the plurality of dummy pixels DP may be arranged in the same column as the column in which the first pixels P1, the second pixels P2, or the third pixels P3 are arranged.

An arrangement structure of the plurality of first to third pixels P1 to P3 and the plurality of dummy pixels DP may be changed to various types known to those skilled in the art.

Figure 4:
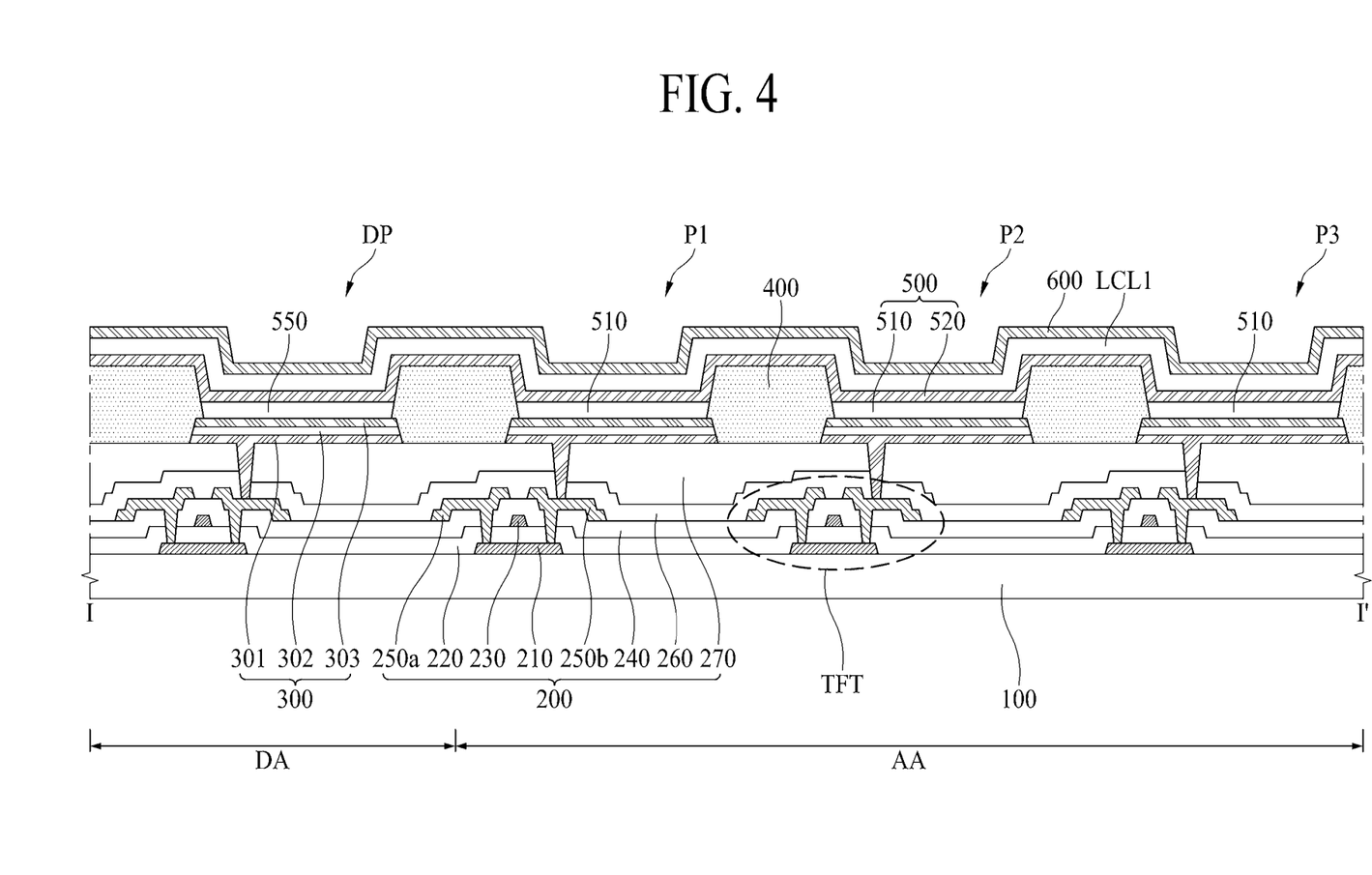
FIG. 4 is a cross-sectional view of an electroluminescence display apparatus according to an embodiment of the present disclosure and is a cross-sectional view taken along line I-I' of FIG. 3.
Figure 5:
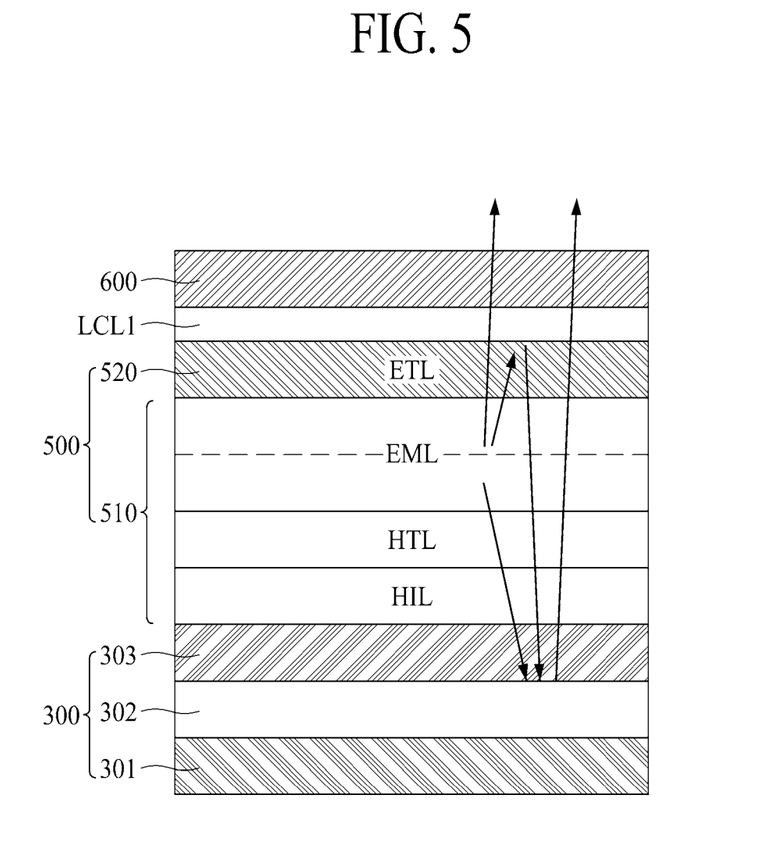
FIG. 5 is a schematic cross-sectional view illustrating an organic light emitting device of an electroluminescence display apparatus according to a first embodiment of the present disclosure.

FIG. 4 is a cross-sectional view of an electroluminescence display apparatus according to an embodiment of the present disclosure and is a cross-sectional view taken along line I-I' of FIG. 3, and FIG. 5 is a schematic cross-sectional view illustrating an organic light emitting device of an electroluminescence display apparatus according to a first embodiment of the present disclosure.

As seen in FIG. 4, the electroluminescence display apparatus according to the first embodiment of the present disclosure may include an active area AA and a dummy area DA, which are provided on a substrate 100.

The substrate 100 may be formed of glass, plastic, or the like, but is not limited thereto. The substrate 100 may be formed of a transparent material, or may be formed of an opaque material.

The electroluminescence display apparatus according to the first embodiment of the present disclosure may be implemented as a top emission type where emitted light travels to an upper portion, and in this case, a material of the substrate 100 may use an opaque material as well as a transparent material. In addition, the electroluminescence display apparatus according to the first embodiment of the present disclosure may be implemented as a bottom emission type where emitted light travels to a lower portion, and in this case, the material of the substrate 100 may use a transparent material.

A circuit element layer 200, a first electrode 300, a bank 400, a light emitting layer 500, a first light compensation layer LCL1, and a second electrode 600 may be provided in the active area AA on the substrate 100. In one embodiment, the second electrode 600 may extend to the dummy area DA, as shown in FIG. 4.

The circuit element layer 200 may be provided on the substrate 100. The circuit element layer 200 may include an active layer 210, a gate insulation layer 220, a gate electrode 230, an interlayer insulation layer 240, a source electrode 250a, a drain electrode 250b, a passivation layer 260, and a planarization layer 270.

The active layer 210 may be provided on the substrate 100. The active layer 210 may be formed of a silicon-based semiconductor material, an oxide semiconductor material, and/or the like, but is not limited thereto. Although not shown, a light blocking layer may be additionally provided between the substrate 100 and the active layer 210 and may block the traveling of light to the active layer 210, thereby preventing the active layer 210 from being degraded.

The gate insulation layer 220 may be provided on the active layer 210 and may insulate the active layer 210 from the gate electrode 230.

The gate electrode 230 may be provided on the gate insulation layer 220.

The interlayer insulation layer 240 may be provided on the gate electrode 230 and may insulate the gate electrode 230 from the source and drain electrodes 250a and 250b.

The source electrode 250a and the drain electrode 250b may face each other and may be spaced apart from each other on the interlayer insulation layer 240. The source electrode 250a may be connected to one end of the active layer 210 through a contact hole which is provided in the interlayer insulation layer 240 and the gate insulation layer 220, and the drain electrode 250b may be connected to the other end of the active layer 210 through another contact hole which is provided in the interlayer insulation layer 240 and the gate insulation layer 220.

The passivation layer 260 may be provided on the source electrode 250a and the drain electrode 250b and may protect a thin film transistor (TFT).

The planarization layer 270 may be provided on the passivation layer 260 and may planarize a surface on the substrate 100.

As described above, the circuit element layer 200 may include a TFT which includes the active layer 210, the gate electrode 230, the source electrode 250a, and the drain electrode 250b. In FIG. 4, a TFT having a top gate structure where the gate electrode 230 is provided on the active layer 210 is illustrated, but is not limited thereto. In other embodiments, the circuit element layer 200 may include a TFT having a bottom gate structure where the gate electrode 230 is provided under the active layer 210.

In the circuit element layer 200, a circuit element including various signal lines, TFTs, and a capacitor may be provided in each of a plurality of pixels. The signal lines may include a gate line, a data line, a power line, and a reference line, and the TFTs may include a switching TFT, a driving TFT, and a sensing TFT. The TFT illustrated in FIG. 4 may correspond to the driving TFT.

The switching TFT may be turned on by a gate signal supplied through the gate line and may transfer a data voltage, supplied through the data line, to the driving TFT.

The driving TFT may be turned on by the data voltage transferred from the switching TFT to generate a data current from a power supplied through the power line and may supply the data current to the first electrode 300.

The sensing TFT may sense a threshold voltage deviation of the driving TFT which causes the degradation in image quality. The sensing TFT may supply a current of the driving TFT to the reference line in response to a sensing control signal supplied through the gate line or a separate sensing line.

The capacitor may hold the data voltage supplied to the driving TFT during one frame and may be connected to a gate electrode and a source electrode of the driving TFT.

In a case where the electroluminescence display apparatus according to the first embodiment of the present disclosure is implemented as the top emission type, light emission is not affected by the TFT even when the TFT is disposed under the light emitting layer 500, and thus, the TFT may be disposed under the light emitting layer 500.

The first electrode 300 may be provided on the circuit element layer 200. The first electrode 300 may be patterned in each of the plurality of pixels and may act as an anode of the electroluminescence display apparatus.

When the electroluminescence display apparatus according to the first embodiment of the present disclosure is implemented as the top emission type, the first electrode 300 may include a reflective material for reflecting light, emitted from the light emitting layer 500, to an upper portion. In this case, the first electrode 300 may have a stacked structure including a transparent conductive material layer and a reflective material layer. The first electrode 300 may include a bottom first electrode 301, a middle first electrode 302, and a top first electrode 303.

The bottom first electrode 301 may be provided between the planarization layer 270 and the middle first electrode 302 to enhance an adhesive force between the planarization layer 270 and the middle first electrode 302. Also, the bottom first electrode 301 may protect a lower surface of the middle first electrode 302, thereby preventing the lower surface of the middle first electrode 302 from being corroded.

Therefore, an oxidation rate of the bottom first electrode 301 may be lower than that of the middle first electrode 302. That is, the bottom first electrode 301 may be formed of a material which is stronger in corrosion resistance than a material of the middle first electrode 302. As described above, the bottom first electrode 301 may act as an adhesive force enhancement layer or an anti-corrosion layer and may be formed of an alloy (MoTi) of molybdenum (Mo) and titanium (Ti), but is not limited thereto.

The middle first electrode 302 may be provided between the bottom first electrode 301 and the top first electrode 303. The middle first electrode 302 may be formed of an alloy (APC) of silver (Ag), palladium (Pd), and copper (Cu), or Cu which is low in resistance, but is not limited thereto. The middle first electrode 302 may be formed of metal which is relatively lower in resistance than the bottom first electrode 301. A thickness of the middle first electrode 302 may be set thicker than that of the bottom first electrode 301 so as to reduce a total resistance of the first electrode 300.

The top first electrode 303 may protect an upper surface of the middle first electrode 302, thereby preventing the upper surface of the middle first electrode 302 from being corroded.

Therefore, an oxidation rate of the top first electrode 303 may be lower than that of the middle first electrode 302. That is, the top first electrode 303 may be formed of a material which is stronger in corrosion resistance than a material of the middle first electrode 302. As described above, the top first electrode 303 may act as an adhesive force enhancement layer or an anti-corrosion layer and may be formed of a transparent conductive material such as indium tin oxide (ITO), but is not limited thereto.

The first electrode 300 may be connected to the drain electrode 250b of the TFT through a contact hole which is provided in the planarization layer 270 and the passivation layer 260. The first electrode 300 may be connected to the source electrode 250a of the TFT through a contact hole which is provided in the planarization layer 270 and the passivation layer 260.

The bank 400 may be provided between adjacent pixels of the plurality of pixels P. The bank 400 may be wholly provided in a matrix structure and may form an emission area in an individual pixel P. The bank 400 may be provided on the planarization layer 270 to hide both ends of the first electrode 300. Therefore, a plurality of first electrodes 300 patterned in the plurality of pixels P may be insulated from one another by the bank 400.

The light emitting layer 500 may be provided on the first electrode 300. The light emitting layer 500 may be provided to emit lights of different colors for each of the plurality of pixels P (for example, first to third pixels P1 to P3). In detail, a light emitting layer 500 of the first pixel P1 which is a red pixel may emit red light, a light emitting layer 500 of the second pixel P2 which is a green pixel may emit green light, and a light emitting layer 500 of the third pixel P3 which is a blue pixel may emit blue light.

Referring to FIG. 5, the light emitting layer 500 according to the first embodiment of the present disclosure may include a first light emitting layer 510 and a second light emitting layer 520.

The first light emitting layer 510 may be provided on the first electrode 300. The first light emitting layer 510 may be provided in an emission area formed by the bank 400. The first light emitting layer 510 may include a hole injecting layer (HIL), a hole transporting layer (HTL), and an emitting material layer (EML). In a red pixel, the EML may be a red EML R which emits red light. In a green pixel, the EML may be a green EML G which emits green light. In a blue pixel, the EML may be a blue EML B which emits blue light. The first light emitting layer 510 may be formed through an inkjet process. In detail, the first light emitting layer 510 may be patterned in each of the plurality of pixels P through the inkjet process using an inkjet apparatus without a mask. In one embodiment, the hole injecting layer, the hole transporting layer, and the emitting material layer may be formed through an inkjet process.

The second light emitting layer 520 may be provided on the first light emitting layer 510. The second light emitting layer 520 may be wholly formed on the substrate 100 through a deposition process, except for the pad area PA. Therefore, the second light emitting layer 520 may be formed on an upper surface of the bank 400, but is not limited thereto. The second light emitting layer 520 may be patterned in each of the plurality of pixels P by using a mask. The second light emitting layer 520 may include an electron transporting layer (ETL). In one embodiment, the electron transporting layer may be formed through a deposition process.

The first light compensation layer LCL1 may be disposed on the light emitting layer 500 and may be disposed between the light emitting layer 500 and the second electrode 600. The first light compensation layer LCL1 may be disposed on the second light emitting layer 520, namely, the ETL. The first light compensation layer LCL1 may be wholly formed on the substrate 100 through a deposition process, except for the pad area PA. Therefore, the first light compensation layer LCL1 may be formed on the bank 400, but is not limited thereto. In another embodiment, the first light compensation layer LCL1 may be patterned in each of the plurality of pixels P by using a mask.

The first light compensation layer LCL1 may have a refractive index which is lower than that of the light emitting layer 500. In detail, the first light compensation layer LCL1 may have a refractive index which is lower than that of an EML of the first light emitting layer 510. Therefore, light emitted from the EML may be reflected by the first light compensation layer LCL1 having a low refractive index and may be incident on the light emitting layer 500 again.

In the related art electroluminescence display apparatus, since light emitted from the EML is extracted to the outside directly or light is extracted to the outside after being reflected only once by the first electrode 300, a micro-cavity effect is not large. Also, when the second electrode 600 uses a material having a high reflectance for increasing the micro-cavity effect, a light transmittance is reduced, and due to this, light extraction is reduced.

In order to solve such a problem, in the electroluminescence display apparatus according to the first embodiment of the present disclosure, the first light compensation layer LCL1 having a lower refractive index than that of the light emitting layer 500 may be disposed between the light emitting layer 500 and the second electrode 600, and thus, the micro-cavity effect may increase.

In more detail, light traveling to the first electrode 300 among lights emitted from the EML may be again reflected to the EML by the middle first electrode 302 of the first electrode 300. The light reflected to the EML may pass through the EML and may be again reflected to the EML by the first light compensation layer LCL1. Also, light traveling to the second electrode 600 among the lights emitted from the EML may be again reflected to the EML by the first light compensation layer LCL1. The light reflected to the EML may pass through the EML and may be again reflected to the second electrode 600 by the first electrode 300.

As described above, in the electroluminescence display apparatus according to the first embodiment of the present disclosure, light may be repeatedly reflected between the light emitting layer 500 and the first electrode 300, and thus, light efficiency may increase, while increasing the micro-cavity effect. Also, the first light compensation layer LCL1 having a refractive index lower than that of the light emitting layer 500 may be disposed between the light emitting layer 500 and the second electrode 600, the micro-cavity effect may increase even without the second electrode 600 being formed of a material having a high reflectance, thereby preventing light extraction from being reduced due to the reduction in transmittance.

The micro-cavity effect may denote that light is amplified or offset by a relationship between a space distance by which light is reflected from the EML of the light emitting layer 500 and a wavelength of the reflected light. That is, a red EML R, a green EML G, and a blue EML B may emit lights having different wavelengths, and thus, an amplification effect by the first light compensation layer LCL1 may be differently shown in the pixels P.

In this case, the first light compensation layer LCL1 may have a thickness of 5 nm or less. When a thickness of the first light compensation layer LCL1 is more than 5 nm, an electron injected from the second electrode 600 may not smoothly be injected into the ETL due to a resistance of the first light compensation layer LCL1.

Moreover, in the electroluminescence display apparatus according to the first embodiment of the present disclosure, the first light compensation layer LCL1 may be disposed between the light emitting layer 500 and the second electrode 600, thereby protecting the light emitting layer 500.

In more detail, the second electrode 600 may be formed of a metal material, and thus, when the second electrode 600 is formed on the light emitting layer 500 including an organic material through a deposition process, an issue may occur at an interface between the light emitting layer 500 and the second electrode 600. However, in the electroluminescence display apparatus according to the first embodiment of the present disclosure, the second electrode 600 may not be formed directly on the light emitting layer 500, but may be formed on the first light compensation layer LCL1 after the first light compensation layer LCL1 is formed on the light emitting layer 500, thereby protecting the light emitting layer 500 from damage which occurs when forming the second electrode 600. As described above, in the electroluminescence display apparatus according to the first embodiment of the present disclosure, the first light compensation layer LCL1 may protect the light emitting layer 500, thereby preventing a device characteristic of the light emitting layer 500 from being reduced.

The first light compensation layer LCL1 may be formed of an oxide-based material having an insulating characteristic, and for example, may be formed of aluminum oxide ($Al_2O_3$). Also, the first light compensation layer LCL1 may be formed of a polymer-based material having an insulating characteristic, and for example, may be formed of poly (methylmethacrylate) or polydimethylsiloxane.

The second electrode 600 may be provided on the light emitting layer 500 and may function as a cathode of the electroluminescence display apparatus. The second electrode 600 may be provided on the bank 400 as well as the light emitting layer 500. Therefore, the second electrode 600 may function as a common electrode which receives a common voltage applied to the plurality of pixels P.

An encapsulation layer (not shown) may be provided on the second electrode 600. The encapsulation layer may be disposed to cover the active area AA, and moreover, may be disposed to cover the dummy area DA. The encapsulation layer may prevent oxygen or moisture from penetrating into the TFT, the first electrode 300, the light emitting layer 500, and the second electrode 600. To this end, the encapsulation layer may include at least one inorganic layer and at least one organic layer.

A circuit element layer 200, a first electrode 300, a bank 400, a dummy light emitting layer 550, and a second electrode 600 may be provided in the dummy area DA on the substrate 100.

The circuit element layer 200 provided in the dummy area DA may be formed to have the same structure through the same process as the circuit element layer 200 provided in the active area AA.

However, the present embodiment is not limited thereto. In other embodiments, some of the signal lines such as a gate line, a data line, a power line, and a reference line may not be provided in the circuit element layer 200 provided in the dummy area DA, or at least one of a switching TFT and a driving TFT may not be provided in the circuit element layer 200. Therefore, light may not be emitted in the dummy area DA. Depending on the case, the circuit element layer 200 provided in the dummy area DA may be unstably configured so that one of the switching TFT and the driving TFT does not operate.

The first electrode 300 provided in the dummy area DA may be formed to have the same structure through the same process as the first electrode 300 provided in the active area AA. However, in another embodiment, the first electrode 300 may not be provided in the dummy area DA, and thus, light may not be emitted in the dummy area DA. Depending on the case, the first electrode 300 provided in the dummy area DA may not be connected to the drain electrode 250b or the source electrode 250a of the TFT, and thus, light may not be emitted in the dummy area DA.

The bank 400 provided in the dummy area DA may be provided between adjacent dummy pixels of a plurality of dummy pixels DP. The bank 400 provided in the dummy area DA may form a dummy emission area in an individual dummy pixel DP. In the drawing, only one dummy pixel DP is illustrated as being provided in the dummy area DA, but the plurality of dummy pixels DP may be provided in the dummy area DA.

Similarly to the bank 400 provided in the active area AA, the bank 400 provided in the dummy area DA may be wholly provided in a matrix structure and may form the dummy emission area in an individual dummy pixel DP. As a result, the bank 400 may be provided in the matrix structure in the active area AA and the dummy area DA.

The dummy light emitting layer 550 provided in the dummy area DA may be provided on the first electrode 300. The dummy light emitting layer 550 provided in the dummy area DA may be formed of the same material to have the same thickness as the light emitting layer 500 provided in the active area AA.

Since the dummy area DA is not a display area which displays an image, the dummy pixels DP provided in the dummy area DA may be configured so as not to emit light. However, when light is emitted in the dummy area DA, the display quality of the electroluminescence display apparatus is degraded due to light leakage occurring in the dummy area DA.

In order for light to be not emitted from the dummy pixels DP, a TFT may not be provided in the circuit element layer 200 disposed in the dummy area DA, or the first electrode 300 may not be provided in the dummy area DA.

The second electrode 600 provided in the dummy area DA may be formed in a structure which extends from the second electrode 600 provided in the active area AA. However, in another embodiment, the second electrode 600 may not be provided in the dummy area DA, and thus, light may not be emitted in the dummy area DA.

An encapsulation layer (not shown) may be formed on the second electrode 600 provided in the dummy area DA and may extend from the encapsulation layer provided in the active area AA. The encapsulation layer may be formed of an inorganic insulating material, or may be formed in a structure where an inorganic insulating material and an organic insulating material are alternately stacked, but is not limited thereto.

As described above, in the electroluminescence display apparatus according to the first embodiment of the present disclosure, since the first light compensation layer LCL1 having a refractive index lower than that of the light emitting layer 500 is disposed between the light emitting layer 500 and the second electrode 600, light may be repeatedly reflected, and thus, light efficiency may increase, while increasing the micro-cavity effect.

Moreover, in the electroluminescence display apparatus according to the first embodiment of the present disclosure, since the first light compensation layer LCL1 having a refractive index lower than that of the light emitting layer 500 is disposed between the light emitting layer 500 and the second electrode 600, the micro-cavity effect may increase even without the second electrode 600 being formed of a material having a high reflectance, thereby preventing light extraction from being reduced due to the reduction in transmittance.

Moreover, in the electroluminescence display apparatus according to the first embodiment of the present disclosure, since the first light compensation layer LCL1 is disposed between the light emitting layer 500 and the second electrode 600, the light emitting layer 500 may be protected, thereby preventing a device characteristic of the light emitting layer 500 from being reduced.

Figure 6:
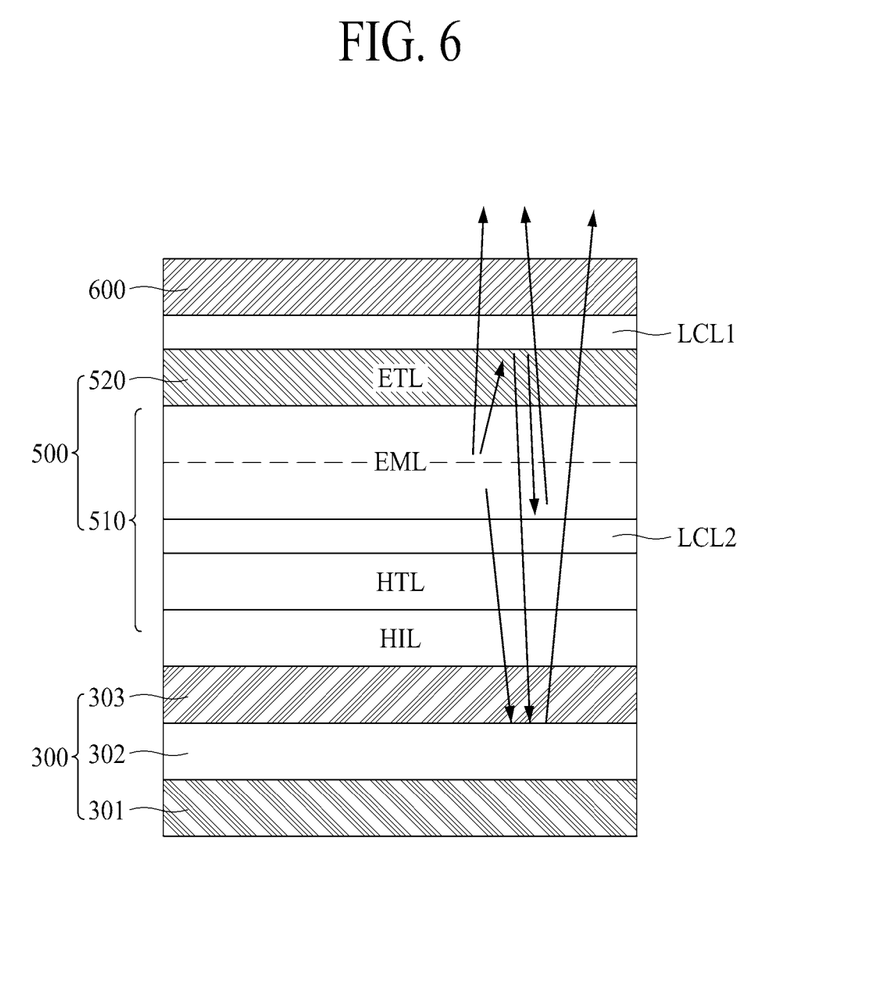
FIG. 6 is a schematic cross-sectional view illustrating an organic light emitting device of an electroluminescence display apparatus according to a second embodiment of the present disclosure.

FIG. 6 is a schematic cross-sectional view illustrating an organic light emitting device of an electroluminescence display apparatus according to a second embodiment of the present disclosure.

FIG. 6 is a schematic cross-sectional view illustrating the organic light emitting device of the electroluminescence display apparatus according to the second embodiment of the present disclosure and is the same as the electroluminescence display apparatus according to the embodiment of FIGS. 4 and 5, except for that a second light compensation layer LCL2 is further provided. Hereinafter, therefore, like reference numerals refer to like elements, and only different elements will be described.

Referring to FIG. 6, the organic light emitting device of the electroluminescence display apparatus according to the second embodiment of the present disclosure may include a first electrode 300, a light emitting layer 500, a first light compensation layer LCL1, and a second light compensation layer LCL2.

In the electroluminescence display apparatus according to the second embodiment of the present disclosure, the organic light emitting device illustrated in FIG. 6 represents the organic light emitting device of one or two of a first pixel P1, a second pixel P2, or a third pixel P3. Hereinafter, for example, an organic light emitting device of the second pixel P2 emitting green light will be described, but the present embodiment is not limited thereto.

In the electroluminescence display apparatus according to the second embodiment of the present disclosure, only the first light compensation layer LCL1 may be disposed in a first pixel P1 emitting red light and a third pixel P3 emitting blue light, and the first light compensation layer LCL1 and the second light compensation layer LCL2 may be disposed in a second pixel P2 emitting green light.

The second light compensation layer LCL2 may be disposed on an HTL and may be disposed between a green EML G and the HTL. The second light compensation layer LCL2 may be formed through an inkjet process. In detail, the second light compensation layer LCL2 may be patterned through the inkjet process using an inkjet apparatus without a mask.

The second light compensation layer LCL2 may have a refractive index which is lower than that of the green EML G. Therefore, light emitted from the green EML G may be reflected by the second light compensation layer LCL2 having a low refractive index and may be incident on the light emitting layer 500 again. In the electroluminescence display apparatus according to the second embodiment of the present disclosure, the second light compensation layer LCL2 having a refractive index lower than that of the green EML G may be disposed between the green EML G and the HTL, thereby increasing the micro-cavity effect.

In more detail, light traveling to the first electrode 300 among lights emitted from the green EML G may be again reflected to the green EML G by a middle first electrode 302 of the first electrode 300. The light reflected to the green EML G may pass through the green EML G and may be again reflected to the green EML G by the first light compensation layer LCL1. The light reflected to the green EML G may pass through the green EML G and may be again reflected to the first light compensation layer LCL1 by the second light compensation layer LCL2.

As described above, in the electroluminescence display apparatus according to the second embodiment of the present disclosure, light may be repeatedly reflected between the green EML G, the first electrode 300, the first light compensation layer LCL1, and the second light compensation layer LCL2, and thus, light efficiency may increase, while increasing the micro-cavity effect. Also, the first light compensation layer LCL1 having a refractive index lower than that of the light emitting layer 500 may be disposed between the light emitting layer 500 and the second electrode 600, the micro-cavity effect may increase even without the second electrode 600 being formed of a material having a high reflectance, thereby preventing light extraction from being reduced due to the reduction in transmittance.

Moreover, in the electroluminescence display apparatus according to the second embodiment of the present disclosure, since the first light compensation layer LCL1 is disposed between the light emitting layer 500 and the second electrode 600, the light emitting layer 500 may be protected.

In more detail, the second electrode 600 may be formed of a metal material, and thus, when the second electrode 600 is formed on the light emitting layer 500 including an organic material through a deposition process, an issue may occur at an interface between the light emitting layer 500 and the second electrode 600. However, in the electroluminescence display apparatus according to the second embodiment of the present disclosure, the second electrode 600 may not be formed directly on the light emitting layer 500, but may be formed on the first light compensation layer LCL1 after the first light compensation layer LCL1 is formed on the light emitting layer 500, thereby protecting the light emitting layer 500 from damage which occurs when forming the second electrode 600. As described above, in the electroluminescence display apparatus according to the second embodiment of the present disclosure, the first light compensation layer LCL1 may protect the light emitting layer 500, thereby preventing a device characteristic of the light emitting layer 500 from being reduced.

The first light compensation layer LCL1 and the second light compensation layer LCL2 may be formed of an oxide-based material having an insulating characteristic, and for example, may be formed of $Al_2O_3$. Also, the first light compensation layer LCL1 and the second light compensation layer LCL2 may be formed of a polymer-based material having an insulating characteristic, and for example, may be formed of poly(methylmethacrylate) or polydimethylsiloxane.

In this case, the second light compensation layer LCL2 may have a thickness of 5 nm or less. When a thickness of the second light compensation layer LCL2 is more than 5 nm, a hole injected from an HTL may not smoothly be injected into the green EML G due to a resistance of the second light compensation layer LCL2. As described above, in the electroluminescence display apparatus according to the second embodiment of the present disclosure, the first and second light compensation layers LCL1 and LCL2 based on a refractive index difference may be provided without any change in thickness of the light emitting layer 500, and thus, reflective properties may be used, thereby obtaining an amplification effect by using a vertically reflected wave.

Moreover, in the electroluminescence display apparatus according to the second embodiment of the present disclosure, since the second light compensation layer LCL2 having a refractive index lower than that of the green EML G is disposed between the green EML G and the HTL, the micro-cavity effect may increase even without the second electrode 600 being formed of a material having a high reflectance, thereby preventing light extraction from being reduced due to the reduction in transmittance.

Moreover, in the electroluminescence display apparatus according to the second embodiment of the present disclosure, the first light compensation layer LCL1 and the second light compensation layer LCL2 may be disposed in the organic light emitting device of one or two of the first to third pixels P1 to P3, and only the first light compensation layer LCL1 may be disposed in the other pixels P, whereby the pixels P may be configured to have different structures. Therefore, in the electroluminescence display apparatus according to the second embodiment of the present disclosure, since the second light compensation layer LCL2 is formed through the inkjet process, the second light compensation layer LCL2 may be selectively provided in each of the pixels P, and thus, the pixels P may be configured to have different structures.

As described above, in the electroluminescence display apparatus according to the embodiments of the present disclosure, since the first light compensation layer having a refractive index lower than that of the light emitting layer is disposed between the light emitting layer and the second electrode, light may be repeatedly reflected, and thus, light efficiency may increase, while increasing the micro-cavity effect.

Moreover, in the electroluminescence display apparatus according to the embodiments of the present disclosure, since the first light compensation layer having a refractive index lower than that of the light emitting layer is disposed between the light emitting layer and the second electrode, the micro-cavity effect may increase even without the second electrode being formed of a material having a high reflectance, thereby preventing light extraction from being reduced due to the reduction in transmittance.

Moreover, in the electroluminescence display apparatus according to the embodiments of the present disclosure, since the first light compensation layer is disposed between the light emitting layer and the second electrode, the light emitting layer may be protected, thereby preventing a device characteristic of the light emitting layer from being reduced.

To achieve the aforementioned advantages and in accordance with the purpose of the disclosure, as embodied and broadly described herein, one aspect of an electroluminescence display apparatus includes a substrate including an active area where a plurality of pixels are provided, a circuit element layer disposed on the substrate, a first electrode disposed on the circuit element layer, a light emitting layer disposed on the first electrode, a second electrode disposed on the light emitting layer, and a first light compensation layer disposed between the light emitting layer and the second electrode.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display apparatus comprising:
    a substrate including an active area where a red pixel, a green pixel, and a blue pixel are provided;
    a circuit element layer disposed on the substrate;
    a first electrode disposed on the circuit element layer;
    a light emitting layer disposed on the first electrode, the light emitting layer including a hole transporting layer and an emitting material layer;
    a second electrode disposed on the light emitting layer; and
    a first light compensation layer disposed between the light emitting layer and the second electrode,
    wherein the light emitting layer of the green pixel further includes a second light compensation layer,
    the second light compensation layer contacts both the hole transporting layer and the emitting material layer in the green pixel,
    the hole transporting layer contacts the emitting material layer in the red pixel and in the blue pixel, and
    the first light compensation layer has a lower refractive index than the emitting material layer.

2. The electroluminescence display apparatus of claim 1, wherein the first light compensation layer has a thickness of 5 nm or less.

3. The electroluminescence display apparatus of claim 1, wherein the light emitting layer includes an electron transporting layer, and the first light compensation layer is between the electron transporting layer and the second electrode.

4. The electroluminescence display apparatus of claim 3, wherein the light emitting layer further includes a hole injection layer,
    wherein the hole injecting layer, the hole transporting layer, and the emitting material layer are formed through an inkjet process, and the electron transporting layer is formed through a deposition process.

5. The electroluminescence display apparatus of claim 1, wherein the first light compensation layer is formed through a deposition process.

6. The electroluminescence display apparatus of claim 1, wherein the first light compensation layer and the second light compensation layer have a lower refractive index than the emitting material layer.

7. The electroluminescence display apparatus of claim 1, wherein the second light compensation layer is formed through an inkjet process.

8. The electroluminescence display apparatus of claim 1, wherein
    the first electrode having a bottom first electrode, a middle first electrode disposed on the bottom first electrode, and a top first electrode disposed on the middle first electrode, and
    the middle first electrode includes an alloy of silver (Ag), palladium (Pd), and copper (Cu).

9. A display apparatus comprising:
    a red pixel, a green pixel, and a blue pixel, each including:
        a first electrode;
        a second electrode;
        a light emitting layer positioned between the first electrode and the second electrode, the light emitting layer including a hole transporting layer and an emitting material layer; and
        a first light compensation layer positioned between the light emitting layer and the second electrode;
    wherein the light emitting layer of the green pixel further includes a second light compensation layer,
    the second light compensation layer contacts both the hole transporting layer and the emitting material layer in the green pixel and
    the hole transporting layer contacts the emitting material layer in the red pixel and in the blue pixel, and
    a refractive index of the first light compensation layer is lower than the refractive index of the emitting material layer.

10. The display apparatus of claim 9, wherein the first electrode further comprising:
    a top first electrode;
    a bottom first electrode; and
    a middle first electrode, the middle first electrode positioned between the top first electrode and the bottom first electrode,
    wherein the top first electrode is positioned between the middle first electrode and the light emitting layer.

11. The display apparatus of claim 10, wherein the middle first electrode is formed of metal having relatively lower resistance than that of the bottom first electrode.

12. The display apparatus of claim 10, wherein a thickness of the middle first electrode is thicker than that of the bottom first electrode.

13. The display apparatus of claim 10, wherein an oxidation rate of the top first electrode is lower than that of the middle first electrode.

14. The display apparatus of claim 9, wherein the light emitting layer further includes an electron transport layer, and the emitting material layer has a higher refractive index than the second light compensation layer.

15. The display apparatus of claim 14, wherein a light reflected from the emitting material layer of the light emitting layer is amplified based on a wavelength of the reflected light and a distance between the emitting material layer and at least one of the electron transport layer, the first light compensation layer, the second light compensation layer, the first electrode, and the second electrode.

* * * * *